US012660405B2

(12) United States Patent
Nakamura et al.

(10) Patent No.: US 12,660,405 B2
(45) Date of Patent: Jun. 16, 2026

(54) SEMICONDUCTOR MATERIAL AND PHOTOELECTRIC CONVERSION ELEMENT

(71) Applicant: Panasonic Intellectual Property Management Co., Ltd., Osaka (JP)

(72) Inventors: Toru Nakamura, Osaka (JP); Maki Hiraoka, Nara (JP); Hiroshi Higuchi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 32 days.

(21) Appl. No.: 18/505,157

(22) Filed: Nov. 9, 2023

(65) Prior Publication Data

US 2024/0090309 A1 Mar. 14, 2024

Related U.S. Application Data

(63) Continuation of application No. PCT/JP2021/047006, filed on Dec. 20, 2021.

(30) Foreign Application Priority Data

May 19, 2021 (JP) ................................ 2021-084959

(51) Int. Cl.
*H10K 30/86* (2023.01)
*C08G 73/02* (2006.01)
(Continued)

(52) U.S. Cl.
CPC ........... *H10K 30/86* (2023.02); *H10K 85/111* (2023.02); *H10K 85/50* (2023.02); *H10K 85/658* (2023.02);
(Continued)

(58) Field of Classification Search
CPC .... H10K 85/111; H10K 85/658; H10K 85/50; H10K 30/86
See application file for complete search history.

(56) References Cited

U.S. PATENT DOCUMENTS

2004/0054095 A1* 3/2004 Allen .................... C08G 73/00 525/461
2024/0244956 A1 7/2024 Okumura

FOREIGN PATENT DOCUMENTS

CN 108365103 A * 8/2018
CN 110444670 A 11/2019
(Continued)

OTHER PUBLICATIONS

English machine translation of CN 108365103A. (Year: 2018).*
(Continued)

*Primary Examiner* — Lindsey A Buck
(74) *Attorney, Agent, or Firm* — Greenblum & Bernstein, P.L.C.

(57) ABSTRACT

A semiconductor material of the present disclosure is represented by formula (I) below, in which $R^1$, $R^2$, and $R^3$ each independently represent a hydrogen atom or a hydrocarbon group having 1 to 6 carbon atoms, $R^4$ represents an aryl group, an amino group, a hydroxy group, or an alkoxy group, and n represents an integer greater than or equal to 2; and a photoelectric conversion element of the present disclosure includes a first electrode, a photoelectric conversion layer, a hole transport layer, and a second electrode in this order, in which the hole transport layer includes the semiconductor material of the present disclosure:
(Continued)

(I)

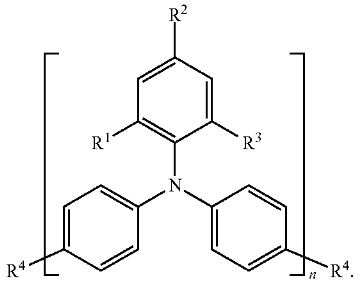

5 Claims, 3 Drawing Sheets

(51) Int. Cl.
*H10K 30/50* (2023.01)
*H10K 85/10* (2023.01)
*H10K 85/50* (2023.01)
*H10K 85/60* (2023.01)

(52) U.S. Cl.
CPC .......... *C08G 73/02* (2013.01); *C08G 73/026* (2013.01); *H10K 30/50* (2023.02); *H10K 85/631* (2023.02)

(56) References Cited

FOREIGN PATENT DOCUMENTS

| | | |
|---|---|---|
| JP | 2011-096436 | 5/2011 |
| JP | 2015-228527 | 12/2015 |
| JP | 2019-175970 | 10/2019 |
| WO | 2020/175705 | 9/2020 |
| WO | 2023/054073 A1 | 4/2023 |

OTHER PUBLICATIONS

International Search Report of PCT application No. PCT/JP2021/047006 dated Feb. 8, 2022.

Junsheng Luo et al., "Toward high-efficiency, hysteresis-less, stable perovskite solar cells: unusual doping of a hole-transporting material using a fluorine-containing hydrophobic Lewis acid", Energy & Environmental Science, 2018, vol. 11, Apr. 5, 2018, pp. 2035-2045.

The EPC Office Action dated Oct. 30, 2024 for the related European Patent Application No. 21940899.4.

Farokhi Afsaneh et al: "The evolution of triphenylamine hole transport materials for efficient perovskite solar cells", Chemical Society Reviews, vol. 51, No. 14, Jan. 1, 2020 (Jan. 1, 2020), pp. 5974-6064, XP093089788.

Miguel Albaladejo-Siguan et al: "Bis(stearoyl) Sulfide: A Stable, Odor-free Sulfur Precursor for High-Efficiency Metal Sulfide Quantum Dot Photovoltaics", arxiv.org, Cornell University Library, 201 Olin Library Cornell University Ithaca, NY 14853, Apr. 17, 2020 (Apr. 17, 2020), XP091731343.

Liu Jiang et al: "Lewis-Acid Doping of Triphenylamine-Based Hole Transport Materials Improves the Performance an Stability of Perovskite Solar Cells", Applied Materials & Interfaces, vol. 12, No. 21, May 15, 2020 (May 15, 2020), pp. 23874-23884, XP093092558.

Schloemer Tracy H. et al ; "Doping strategies for small molecule organic hole-transport materials: impacts on perovskite solar cell performance and stability", Chemical Science, vol. 10, No. 7, Feb. 13, 2019 (Feb. 13, 2019), p. 1904-1935, XP055848372.

Luo Junsheng et al: "Toward high-efficiency, hysteresis-less, stable perovskite solar cells: unusual doping of a hole-transporting material using a fluorine-containing hydrophobic Lewis acid", Energy & Environmental Science vol. 11, Apr. 5, 2018 (Apr. 5, 2018), pp. 2035-2045, XP055885580.

Ye Tengling et al: "Enhanced Efficiency of Planar Heterojunction Perovskite Solar Cells by a Light Soaking Treatment on Tris (pentafluorophenyl) borane-Doped Poly (triarylamine) Solution", Applied Materials & Interfaces, American Chemical Society, US, vol. 11, No. 15, Apr. 17, 2019 (Apr. 17, 2019), pp. 14004-14010, XP009557726.

Luo Junsheng et al: "Toward high-efficiency, hysteresis-less stable perovskite solar cells: unusual doping of a hole-transporting material using a fluorine-containing hydrophobic Lewis acid", Energy & Environmental Society of Chemistry Science, Royal, vol. 11, No. 8, Jan. 1, 2018 (Jan. 1, 2018), pp. 2035-2045, XP009557727.

Neigenfind Philipp et al: "Synthesis of sterically encumbered di- and triarylamines by palladium-catalysed ca N coupling reactions under mild reaction conditions", Catalysis Science & Technology, Royal Society of Chemistry, vol. 12, No. 11, Jun. 6, 2020 (Jun. 6, 2020), pp. 3447-3453, XP009557728.

Li Mubai et al: "Underlying Interface Defect Passivation and Charge Transfer Enhancement via Sulfonated Hole-Transporting Materials for Efficient Inverted Perovskite Solar Cells", Applied Materials & Interfaces, American Chemical Society, US, vol. 14, No. 47, Nov. 30, 2020 (Nov. 30, 2020), pp. 53331-53339, XP009557729.

* cited by examiner

SEMICONDUCTOR MATERIAL AND PHOTOELECTRIC CONVERSION ELEMENT

BACKGROUND

1. Technical Field

The present disclosure relates to a semiconductor material and a photoelectric conversion element.

2. Description of the Related Art

Semiconductor elements using silicon, which is an inorganic semiconductor material, require high temperature and high vacuum process in a procedure for forming same. Accordingly, it has been difficult to increase areas and reduce costs for semiconductor elements using silicon.

An organic semiconductor device using an organic semiconductor material has been expected to be applied for various uses. This is because, for example, production process temperature can be decreased compared with inorganic semiconductor devices using conventional inorganic semiconductor materials, a film thereof can be formed in simple process such as application since organic semiconductor materials are dissolved in a solvent well.

SUMMARY

High charge mobility is required of organic semiconductor materials used for organic semiconductor devices. In addition, materials including triphenylamine as a matrix have been known as a material for selectively transporting holes. However, these materials, as simple substances, have not so high hole mobility. Therefore, a dopant is required to be added to increase conductivity in order to drive devices using the above-described materials.

However, there has been the following problem: the activation rate of the dopant is low, a large amount of the dopant is thus required to be added in order to efficiently operate devices, and an excess amount of the dopant added adversely affects device characteristics on the contrary.

For example, when an organic semiconductor material is used for a photoelectric conversion element such as a solar cell, it has been not easy to enhance photoelectric conversion efficiency of the photoelectric conversion element.

One non-limiting and exemplary embodiment provides a semiconductor material suited to enhance photoelectric conversion efficiency of a photoelectric conversion element.

In one general aspect, the techniques disclosed here feature a semiconductor material represented by formula (I) below. In formula (I), $R^1$, $R^2$, and $R^3$ each independently represent a hydrogen atom or a hydrocarbon group having 1 to 6 carbon atoms. $R^4$ represents an aryl group, an amino group, a hydroxy group, or an alkoxy group. The symbol n represents an integer greater than or equal to 2.

(I)

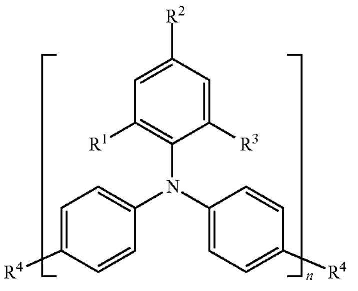

The present disclosure provides a semiconductor material suited to enhance photoelectric conversion efficiency of a photoelectric conversion element.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
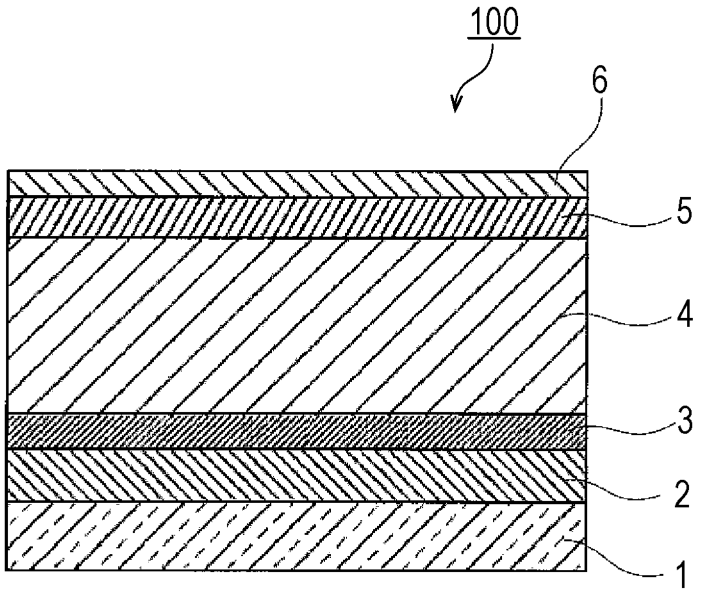
FIG. 1 is a cross-sectional diagram illustrating a photoelectric conversion element according to a second embodiment.

Underlying Knowledge Forming Basis of the Present Disclosure

Conventionally, terminal groups of organic semiconductor polymer compounds contained in hole transport materials have not been focused on. The present inventors have focused thereon and studied the relation between terminal groups of a polytriaryl-based semiconductor compound (hereinafter, also referred to as a "PTAA") and characteristics of a photoelectric conversion element. As a result, it has been newly found that when a PTAA having a certain terminal group is used, photoelectric conversion efficiency of a photoelectric conversion element improves. In addition, it has been newly found that electron donating performance of a PTAA are changed by changing the terminal group, and activity after doping a dopant and the allowable concentration of the dopant change. The present inventors have completed the semiconductor material and the photoelectric conversion element of the present disclosure on the basis of these findings.

J. Luo and other eight authors, "Toward high-efficiency, hysteresis-less, stable perovskite solar cells: unusual doping of a hole-transporting material using a fluorine-containing hydrophobic Lewis acid", Energy & Environmental Science, 2018, vol. 11, p. 2035 reports that solar cell characteristics are maximized when the dopant concentration is 5 mol % based on the mass of repeating units of a PTAA, and the characteristics deteriorate when the dopant concentration is further increased.

Japanese Unexamined Patent Application Publication No. 2019-175970 reports that durability of a solar cell improves when the number average molecular weight of a polytriarylamine-based semiconductor compound is greater than or equal to 8500. However, Japanese Unexamined Patent Application Publication No. 2019-175970 does not focus on terminal groups of the polytriarylamine-based semiconductor compound.

As a result of detailed research on an effect of terminal groups of a PTAA on solar cell characteristics and the mechanism thereof, the present inventors have found that activity and an allowable concentration of a dopant are improved by using a certain terminal group, and solar cell characteristics such as photoelectric conversion efficiency improve. Specifically, it has been found that by using a PTAA having a certain terminal group, solar cell characteristics can be monotonously improved even when the dopant concentration exceeds 10 mol % based on the mass of units of the PTAA, and the photoelectric conversion efficiency is maximized at a dopant concentration of about 30 mol %, for example.

EMBODIMENTS OF PRESENT DISCLOSURE

First Embodiment

Hereinafter, a semiconductor material of the present disclosure will be described.

The semiconductor material according to a first embodiment is represented by formula (I) below.

Provided that, in formula (I), $R^1$, $R^2$, and $R^3$ each independently represent a hydrogen atom or a hydrocarbon group having 1 to 6 carbon atoms. $R^4$ represents an aryl group, an amino group, a hydroxy group, or an alkoxy group. The symbol n represents an integer greater than or equal to 2.

(I)

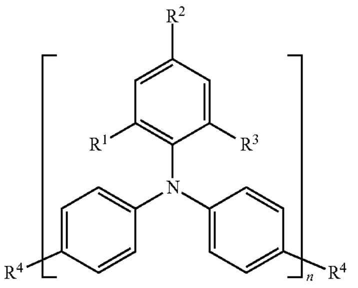

When $R^4$ is an aryl group, an amino group, a hydroxy group, or an alkoxy group, electron donating performance of the semiconductor material is enhanced. As a result, a carrier is efficiently doped when combined with an additive, and conductivity improves. As such, the semiconductor material of the first embodiment is suited to enhance photoelectric conversion efficiency of a photoelectric conversion element.

In formula (I), $R^1$, $R^2$, and $R^3$ each may be a methyl group in order to efficiently dope the carrier.

In formula (I), $R^4$ may be an aryl group in order to efficiently dope the carrier. The aryl group may be a phenyl group.

A number average molecular weight of the semiconductor material according to the first embodiment may be less than or equal to 8000 in order to efficiently dope the carrier.

Second Embodiment

Hereinafter, a photoelectric conversion element of the present disclosure will be described with reference to drawings.

A photoelectric conversion element according to a second embodiment includes a first electrode, a photoelectric conversion layer, a hole transport layer, and a second electrode in this order. The hole transport layer includes the semiconductor material according to the first embodiment.

The photoelectric conversion element according to the second embodiment includes the semiconductor material according to the first embodiment and thus has high photoelectric conversion efficiency.

The photoelectric conversion element according to the second embodiment is used as a solar cell, for example.

FIG. 1 is a cross-sectional diagram illustrating the photoelectric conversion element according to the second embodiment. A photoelectric conversion element 100 illustrated in FIG. 1 is an example of a configuration of the photoelectric conversion element according to the second embodiment.

The photoelectric conversion element 100 includes a substrate 1, a first electrode 2, an electron transport layer 3, a photoelectric conversion layer 4, a hole transport layer 5, and a second electrode 6 in this order.

The photoelectric conversion element 100 may have no electron transport layer 3.

When the photoelectric conversion element 100 is irradiated with light, the photoelectric conversion layer 4 absorbs light to generate an excited electron and a hole. This excited electron moves to the first electrode 2 through the electron transport layer 3. Meanwhile, the hole generated in the photoelectric conversion layer 4 moves to the second electrode 6 via the hole transport layer 5. The photoelectric conversion element 100 can take out current from the first electrode 2 as a negative electrode and the second electrode 6 as a positive electrode in this manner.

The photoelectric conversion element 100 can be produced by the following method, for example.

First, the first electrode 2 is formed on a surface of the substrate 1 by a chemical vapor deposition method, a sputtering method, or the like. Thereafter, the electron transport layer 3 is formed by a chemical vapor deposition method, a sputtering method, a solution coating method, or the like. Thereafter, the photoelectric conversion layer 4 is formed on the electron transport layer 3. For example, a perovskite compound may be cut to have a predetermined thickness to produce the photoelectric conversion layer 4, and the photoelectric conversion layer 4 may be disposed on the electron transport layer 3. Thereafter, the hole transport layer 5 is formed on the photoelectric conversion layer 4 by a chemical vapor deposition method, a sputtering method, a solution coating method, or the like. Thereafter, the second electrode 6 is formed on the hole transport layer 5 by a chemical vapor deposition method, a sputtering method, a solution coating method, or the like. The photoelectric conversion element 100 is obtained as above.

The photoelectric conversion element 100 according to the second embodiment may further include a porous layer. The porous layer is disposed between the electron transport layer and the photoelectric conversion layer, for example.

Figure 2:
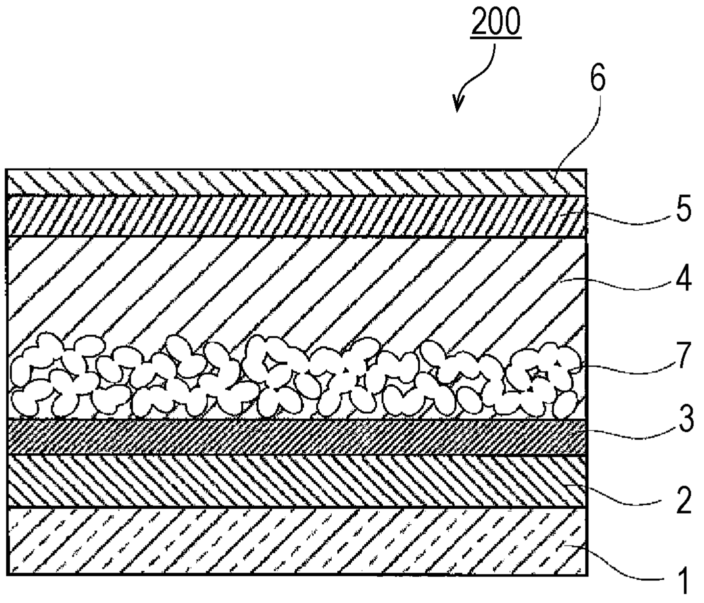
FIG. 2 is a cross-sectional diagram illustrating a variation of the photoelectric conversion element according to the second embodiment.

FIG. 2 is a cross-sectional diagram illustrating a variation of the photoelectric conversion element according to the second embodiment.

A photoelectric conversion element 200 according to the second embodiment includes a substrate 1, a first electrode 2, an electron transport layer 3, a porous layer 7, a photoelectric conversion layer 4, a hole transport layer 5, and a second electrode 6 in this order.

The porous layer 7 includes a porous body. The porous body includes voids.

The photoelectric conversion element 200 may have no electron transport layer 3.

Hereinafter, each component of the photoelectric conversion element will be specifically described.

Substrate 1

The substrate 1 is a peripheral component. The substrate 1 functions to hold each layer of the photoelectric conversion element. The substrate 1 may be formed from a transparent material. A glass substrate or a plastic substrate may be used as the substrate 1, for example. The plastic substrate may be a plastic film, for example.

When the second electrode 6 has translucency, the substrate 1 may be formed from a material having no translucency. Metals, ceramics, and resin materials with low translucency can be used as such a material.

When the first electrode 2 has sufficient strength, the substrate 1 may not be provided because each layer can be held by the first electrode 2.

First Electrode 2

The first electrode 2 has conductivity. The first electrode 2 has translucency. For example, the first electrode 2 transmits light from the visible region to the infrared region.

The first electrode 2 is formed from, for example, a material which is transparent and has conductivity. Examples of the material are a metal oxide and a metal nitride. Examples of such a material are:

(i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) tin oxide doped with at least one selected from the group consisting of antimony and fluorine;

(v) zinc oxide doped with at least one selected from the group consisting of boron, aluminum, gallium, and indium;

(vi) an indium-tin composite oxide; and (vii) a compound thereof.

The first electrode 2 may be formed by using an untransparent material and providing a light transmissive pattern. Examples of the light transmissive pattern are a linear pattern, a dashed pattern, a lattice-shaped pattern, and a punching metal pattern in which a number of fine through holes are regularly or irregularly arranged. When the first electrode 2 has such patterns, light can be transmitted through a portion in which no electrode material is present. Examples of the untransparent material are platinum, gold, silver, copper, aluminum, rhodium, indium, titanium, iron, nickel, tin, zinc, and an alloy including any of these materials. A carbon material having conductivity may be used as the untransparent material.

When the photoelectric conversion element does not include the electron transport layer 3, the first electrode 2 has blocking properties against holes from the photoelectric conversion layer 4. In this case, the first electrode 2 does not come into ohmic contact with the photoelectric conversion layer 4. The blocking properties against holes from the photoelectric conversion layer 4 mean properties of allowing only electrons generated in the photoelectric conversion layer 4 to pass and not allowing holes to pass. Fermi energy levels of materials having such properties are higher than the energy level of the upper end of the valence band of the photoelectric conversion layer 4. Fermi energy levels of materials having such properties may be higher than the Fermi energy of the photoelectric conversion layer 4. Specific materials include aluminum.

When the photoelectric conversion element includes the electron transport layer 3, the first electrode 2 may not have blocking properties against holes from the photoelectric conversion layer 4. In this case, the first electrode 2 may be formed from a material that can form ohmic contact with the photoelectric conversion layer 4. In this case, the first electrode 2 may or may not come into ohmic contact with the photoelectric conversion layer 4.

A light transmittance of the first electrode 2 may be greater than or equal to 50% and may be greater than or equal to 80%, for example. Wavelengths of light to be transmitted by the first electrode 2 depend on absorption wavelengths of the photoelectric conversion layer 4.

A thickness of the first electrode 2 may be greater than or equal to 1 nm and less than or equal to 1000 nm, for example.

Electron Transfer Layer 3

The electron transport layer 3 includes a semiconductor. The electron transport layer 3 may be formed from a semiconductor with a band gap greater than or equal to 3.0 eV. Consequently, visible light and infrared light can be transmitted to the photoelectric conversion layer 4. An example of the semiconductor is an inorganic n-type semiconductor.

Examples of the inorganic n-type semiconductor are a metal oxide, a metal nitride, and a perovskite-type oxide. Examples of the metal oxide are oxides of Cd, Zn, In, Pb, Mo, W, Sb, Bi, Cu, Hg, Ti, Ag, Mn, Fe, V, Sn, Zr, Sr, Ga, Si, and Cr. The metal oxide is, for example, $TiO_2$ or $SnO_2$. The metal nitride is, for example, GaN. The perovskite-type oxide is, for example, $SrTiO_3$ or $CaTiO_3$.

The electron transport layer 3 may include a substance with a band gap greater than 6.0 eV. Examples of the substance with a band gap greater than 6.0 eV are (i) a halide of an alkali metal or an alkaline-earth metal such as lithium fluoride and calcium fluoride;

(ii) an alkali metal oxide such as magnesium oxide; and (iii) silicon dioxide.

In this case, the electron transport layer 3 may have a thickness of, for example, less than or equal to 10 nm in order to ensure electron transporting properties.

The electron transport layer 3 may include a plurality of layers formed from materials different from one another.

Photoelectric Conversion Layer 4

The photoelectric conversion layer 4 includes a photoelectric conversion material.

The photoelectric conversion material may be a perovskite compound, for example. That is, the photoelectric conversion layer 4 may include a perovskite compound. Perovskite compounds have high light absorption coefficients within the solar spectrum wavelength region and have high carrier mobility. Accordingly, a photoelectric conversion element including a perovskite compound has high photoelectric conversion efficiency.

The perovskite compound is, for example, represented by compositional formula $ABX_3$. A is a monovalent cation. Examples of the monovalent cation are an alkali metal cation and an organic cation. Examples of the alkali metal cation are potassium cation ($K^+$), cesium cation ($Cs^+$), and rubidium cation ($Rb^+$). Examples of the organic cation are methylammonium cation ($CH_3NH_3^+$), formamidinium cation ($HC(NH_2)^{2+}$), ethylammonium cation ($CH_3CH_2NH_3^+$), and guanidinium cation ($CH_6N_3^+$). B is a divalent cation. Examples of the divalent cation are lead cation ($Pb^{2+}$) and tin cation ($Sn^{2+}$). X is a monovalent anion. An example of the monovalent anion is a halogen anion. The site of each of A, B, and X may be occupied by different kinds of ions.

A thickness of the photoelectric conversion layer 4 is, for example, greater than or equal to 50 nm and less than or equal to 10 μm.

The photoelectric conversion layer 4 is formed by a solution coating method, a printing method, or a vapor deposition method, for example. The photoelectric conversion layer 4 may be formed by cutting a perovskite compound.

The photoelectric conversion layer 4 may mainly include a perovskite compound represented by compositional formula $ABX_3$. Here, the phrase "the photoelectric conversion layer 4 mainly includes a perovskite compound represented by compositional formula $ABX_3$" means that the photoelectric conversion layer 4 includes the perovskite compound represented by compositional formula $ABX_3$ in an amount of greater than or equal to 90% by mass. The photoelectric conversion layer may include the perovskite compound represented by compositional formula $ABX_3$ in an amount of greater than or equal to 95% by mass. The photoelectric conversion layer 4 may be composed of the perovskite compound represented by compositional formula $ABX_3$. The photoelectric conversion layer 4 may include a defect or an impurity as long as the photoelectric conversion layer 4 includes the perovskite compound represented by compositional formula $ABX_3$.

The photoelectric conversion layer 4 may further include another compound different from the perovskite compound represented by compositional formula $ABX_3$. An example of the another compound is a compound having a Ruddlesden-Popper-type layered perovskite structure.

Hole Transport Layer 5

The hole transport layer 5 has a hole transport material. The hole transport material is a material transporting holes. As described above, the photoelectric conversion element according to the second embodiment contains the semiconductor material according to the first embodiment.

The hole transport layer 5 may further include a polytriarylamine-based semiconductor compound other than the semiconductor material according to the first embodiment. Examples of such a compound are 2,2',7,7'-tetrakis-(N,N-di-p-methoxyphenylamine)9,9'-spirobifluorene, poly[bis(4-phenyl)(2,4,6-trimethylphenyl)amine], poly(3-hexylthiophene-2,5-diyl), poly(3,4-ethylenedioxythiophene), and copper phthalocyanine.

The hole transport layer 5 may also include a plurality of layers formed form materials different from one another. For example, hole transport characteristics are improved by laminating a plurality of layers such that the ionization potential of the hole transport layer 5 successively decreases with respect to the ionization potential of the photoelectric conversion layer 4.

A thickness of the hole transport layer 5 may be greater than or equal to 1 nm and less than or equal to 1000 nm and may be greater than or equal to 10 nm and less than or equal to 50 nm. Consequently, sufficient hole transport characteristics can be exhibited, and low resistance can be maintained; therefore, high photoelectric conversion efficiency can be achieved.

The hole transport layer 5 is formed by a coating method, a printing method, or a vapor deposition method, for example. This is the same as in the photoelectric conversion layer 4. Examples of the coating method are a doctor blade method, a bar coating method, a spraying method, a dip coating method, and a spin coating method. An example of the printing method is a screen printing method. If necessary, a plurality of materials is mixed to produce the hole transport layer 5, and pressurization and heat treatment may be carried out.

The hole transport layer 5 may include an additive in order to improve conductivity. Examples of the additive are a support electrolyte, a solvent, and a dopant. As such, the hole transport layer 5 may include the semiconductor material according to the first embodiment and an additive.

The support electrolyte and the solvent have an effect of stabilizing holes in the hole transport layer 5. The dopant has an effect of increasing the number of holes in the hole transport layer 5.

Examples of the support electrolyte are an ammonium salt, an alkaline-earth metal salt, and a transition metal salt. Examples of the ammonium salt are tetrabutylammonium perchlorate, tetraethylammonium hexafluorophosphate, an imidazolium salt, and a pyridinium salt. Examples of the alkali metal salt are a lithium perchlorate and potassium tetrafluoroborate. An example of the alkaline-earth metal salt is calcium (II) bis(trifluoromethanesulfonyl)imide. Examples of the transition metal salt are zinc (II) bis(trifluoromethanesulfonyl)imide, and tris[4-tert-butyl-2-(1H-pyrazole-1-yl)pyridine]cobalt (III) tris(trifluoromethanesulfonyl)imide. Examples of the dopant are lithium hexafluorophosphate, lithium borofluoride, lithium perchlorate, lithium bis(pentafluoroethanesulfonyl)imide, bis(trifluoromethanesulfonyl)amine, lithium bis(trifluoromethanesulfonyl)imide, zinc bis(trifluoromethanesulfonyl)imide, tris[2-(1H-pyrazole-1-yl)-4-tert-butyl pyridine]cobalt, 4-isopropyl-4-methyldiphenyliodonium tetrakis(pentafluorophenyl)borate, tris(pentafluorophenyl)borane, 2,3,5,6-tetrafluoro-7,7,8,8-tetracyano-quinodimethane, and 1,2,3,4,8,9,10,11,15,16,17,18,22,23,24,25-hexadecafluoro-29H,31H-phthalocyanine. The hole transport layer 5 including such a dopant has high hole transport characteristics. Accordingly, the hole transport layer 5 has high conductivity.

The hole transport layer 5 may include the dopant as an additive. That is, the hole transport layer 5 may include, as an additive, at least one selected from the group consisting of lithium hexafluorophosphate, lithium borofluoride, lithium perchlorate, lithium bis(pentafluoroethanesulfonyl)imide, bis(trifluoromethanesulfonyl)amine, lithium bis(trifluoromethanesulfonyl)imide, zinc bis(trifluoromethanesulfonyl)imide, tris[2-(1H-pyrazole-1-yl)-4-tert-butyl pyridine]cobalt, 4-isopropyl-4-methyldiphenyliodonium tetrakis(pentafluorophenyl)borate, tris(pentafluorophenyl)borane, 2,3,5,6-tetrafluoro-7,7,8,8-tetracyano-quinodimethane, and 1,2,3,4,8,9,10,11,15,16,17,18,22,23,24,25-hexadecafluoro-29H,31H-phthalocyanine. As described above, the hole transport layer 5 including the dopant has high hole transport characteristics and thus can improve conductivity. Accordingly, the photoelectric conversion element 100 including the hole transport layer 5 as described above can enhance photoelectric conversion efficiency.

The hole transport layer 5 may include tris(pentafluorophenyl)borane as an additive. Tris(pentafluorophenyl)borane has strong electron accepting properties and thus can effectively dope the organic semiconductor material with holes.

When the hole transport layer 5 includes the dopant as an additive, the mole number ratio of the additive per mole number based on the mass of repeating units of the semiconductor material in the hole transport layer 5 may be greater than or equal to 10%. In order to enhance photoelectric conversion efficiency, the above ratio may be greater than or equal to 10% and less than or equal to 60% and may be greater than or equal to 10% and less than or equal to 50%. Incidentally, the additive at the above-described ratio is the dopant. That is, in other words, the above ratio is the mole number ratio of the dopant per mole number based on the mass of repeating units of the semiconductor material. When multiple kinds of the dopant are included, the mole number of the dopant is the total mole number of the dopant.

The solvent included in the hole transport layer 5 may have excellent ion conductivity. The solvent may be an aqueous solvent and may be an organic solvent. In order to further stabilize a solute, the solvent included in the hole transport layer 5 may be an organic solvent. Examples of the organic solvent include a heterocyclic compound solvent such as tert-butyl pyridine, pyridine, and n-methyl pyrrolidone.

An ionic liquid may be used as the solvent. The ionic liquid may be used alone or may be mixed with another solvent and used. The ionic liquid has low volatility and high flame retardancy and thus is desirable.

Examples of the ionic liquid are an imidazolium-based liquid such as 1-ethyl-3-methylimidazolium tetracyanoborate, a pyridine-based liquid, an alicyclic amine-based liquid, an aliphatic amine-based liquid, and an azonium amine-based liquid.

Second Electrode 6

The second electrode 6 has conductivity. Since the photoelectric conversion element according to the second embodiment includes the hole transport layer 5, the second electrode 6 may not have blocking properties against electrons from the photoelectric conversion layer 4. That is, the material constituting the second electrode 6 may be a material coming into ohmic contact with the photoelectric conversion layer 4. That is, the second electrode 6 can be formed to have translucency.

Among the first electrode 2 and the second electrode 6, the electrode on the light incident side may have translucency. Accordingly, one of the first electrode 2 and the second electrode 6 may not have translucency. That is, one of the first electrode 2 and the second electrode 6 may not use a material having translucency and may not have a pattern including an opening part through which light passes.

Porous Layer 7

The porous layer 7 is formed on the electron transport layer 3 by, for example, a coating method. When the photoelectric conversion element includes no electron transport layer 3, the porous layer 7 is formed on the first electrode 2.

A porous structure introduced into the porous layer 7 becomes a baes for forming the photoelectric conversion layer 4. The porous layer 7 inhibits neither light absorption by the photoelectric conversion layer 4 nor electron transfer from the photoelectric conversion layer 4 to the electron transport layer 3.

The porous layer 7 includes a porous body.

The porous body is formed from, for example, successive insulating or semiconductor particles. Examples of the insulating particles are aluminum oxide particles and silicon oxide particles. The semiconductor particles are, for example, particles of an inorganic semiconductor. Examples of the inorganic semiconductor are a metal oxide, a perovskite oxide of a metal element, a sulfide of a metal element, and a metal chalcogenide. Examples of the metal oxide are oxides of Cd, Zn, In, Pb, Mo, W, Sb, Bi, Cu, Hg, Ti, Ag, Mn, Fe, V, Sn, Zr, Sr, Ga, Si, and Cr. The metal oxide is, for example, $TiO_2$. Examples of the perovskite oxide of a metal element are $SrTiO_3$ and $CaTiO_3$. Examples of the sulfide of a metal element are CdS, ZnS, $In_2S_3$, PbS, $Mo_2S$, $WS_2$, $Sb_2S_3$, $Bi_2S_3$, $ZnCdS_2$, and $Cu_2S$. Examples of the metal chalcogenide are CsSe, $In_2Se_3$, $WSe_2$, HgS, PbSe, and CdTe.

A thickness of the porous layer 7 may be greater than or equal to 0.01 μm and less than or equal to 10 μm and may be greater than or equal to 0.05 μm and less than or equal to 1 μm.

With respect to surface roughness of the porous layer 7, a surface roughness coefficient obtained from effective area/project area may be greater than or equal to 10 and may be greater than or equal to 100. The project area is an area of a shadow formed behind an object when the object is irradiated with light from the front. The effective area is an actual surface area of the object. The effective area can be calculated from a volume obtained from the project area and the thickness of the object and a specific surface area and a bulk density of a material constituting the object. The specific surface area is, for example, measured by a nitrogen adsorption method.

Voids in the porous layer 7 are connected from a part coming into contact with the photoelectric conversion layer 4 to a part coming into contact with the electron transport layer 3. That is, voids in the porous layer 7 are connected from one principal surface of the porous layer 7 to the other principal surface of the porous layer 7. Consequently, the material of the photoelectric conversion layer 4 fills the voids in the porous layer 7 and can reach a surface of the electron transport layer 3. Therefore, transfer of electrons is possible because the photoelectric conversion layer 4 and the electron transport layer 3 directly contact each other.

By virtue of providing the porous layer 7, an effect of being capable of easily forming the photoelectric conversion layer 4 is brought about. When the porous layer 7 is provided, the material of the photoelectric conversion layer 4 enters the voids of the porous layer 7, and the porous layer 7 forms a scaffold for the photoelectric conversion layer 4. Therefore, the material of the photoelectric conversion layer 4 is less likely to be caused to be repelled by a surface of the porous layer 7 or to aggregate. Accordingly, the photoelectric conversion layer 4 can be easily formed as a uniform film. The photoelectric conversion layer 4 is formed by a coating method, a printing method, or a vapor deposition method, for example.

As light is scattered by the porous layer 7, an effect of increasing the optical path length of light passing through the photoelectric conversion layer 4 is also expected. When the optical path length increases, amounts of electrons and holes generated in the photoelectric conversion layer 4 are expected to increase.

EXAMPLES

Hereinbelow, the present disclosure is described in detail with reference to examples and comparative examples.

A solar cell using an organic semiconductor film and a perovskite compound was produced in each of an example and a comparative example. Electron spin resonance analysis on the organic semiconductor films and initial characteristic evaluation on the solar cells were conducted.

The configuration of each of the solar cells of Example 1 and Comparative Example 1 is as follows. That is, solar cells having the same configuration as the solar cell 200 illustrated in FIG. 2 was produced.

Substrate 1: glass substrate (thickness: 0.7 mm)

First electrode 2: transparent conductive layer, indium-tin composite oxide layer (thickness: 200 nm)

Electron transport layer 3: titanium oxide ($TiO_2$) (thickness: 15 nm)

Porous layer 7: mesoporous structure titanium oxide ($TiO_2$) (thickness: 150 nm)

Photoelectric conversion layer 4: layer mainly including $HC(NH_2)_2PbI_3$ (thickness: 350 nm)

Hole transport layer 5: layer mainly including a PTAA (provided that tris(pentafluorophenyl)borane (manufactured by Tokyo Chemical Industry Co., Ltd.) is included as an additive) (thickness: 40 nm)

Second electrode 6: Au (thickness: 200 nm)

Preparation of Polytriarylamine-Based Semiconductor Material

Poly[bis(4-phenyl)(2,4,6-trimethylphenyl)amine] terminated by phenyl groups was synthesized as a polytriarylamine-based semiconductor material.

Under an argon atmosphere, 7.2 mmol of bis(1,5-cyclooctadiene)nickel (0), 1,2,2-bipyridyl, and 1,5-cyclooctadiene were dissolved in 10 mL of N,N-dimethylformamide and mixed at 80° C. A solution of 3 mmol of N,N-bis(4-bromophenyl)-2,4,6-trimethylaniline dissolved in 20 mL of toluene was added thereto little by little. The obtained mixture was stirred at 90° C. A 1M solution of bromobenzene dissolved in toluene in an amount of 3 mL was added thereto, followed by further stirring. After completion of reaction, the reaction solution was diluted with 1000 mL of chloroform after the temperature thereof was returned to room temperature, and the catalyst was removed by a filter. The product was put into a mixed solution of methanol, acetone, and concentrated hydrochloric acid for precipitation, followed by purification using a Soxhlet extractor. The product remaining on a filter was dissolved in trihydrofurane, which was put into methanol for precipitation, followed by filtration. The obtained product was vacuum dried. A semiconductor material of the example was obtained in this manner.

The weight average molecular weight and the number average molecular weight of the semiconductor material of the example were obtained by gel permeation chromatography. The number average molecular weight (Mn) and the weight average molecular weight (Mw) were 6600 and 9070, respectively. Accordingly, the value of Mw/Mn was 1.37.

Production of Solar Cell

Example 1

First, a glass substrate having a thickness of 0.7 mm was prepared.

A layer of an indium-tin composite oxide was formed on the substrate by a sputtering method. A first electrode was formed in this manner.

Thereafter, a layer of titanium oxide was formed on the first electrode by a sputtering method. An electron transport layer was formed in this manner.

A layer of titanium oxide having a mesoporous structure was formed on the electron transport layer by coating 30NR-D (manufactured by GreatCell Solar Limited) by spin coating and then heat-treated at 500° C. for 30 minutes. A porous layer was formed in this manner.

Thereafter, a raw material solution of a photoelectric conversion material was coated by spin coating to form a photoelectric conversion layer including a perovskite compound. The raw material solution was a solution including 0.92 mol/L of lead iodide (II) (manufactured by Tokyo Chemical Industry Co., Ltd.), 0.17 mol/L of lead bromide (II) (manufactured by Tokyo Chemical Industry Co., Ltd.), 0.83 mol/L of formamidinium iodide (manufactured by GreatCell Solar Limited), 0.17 mol/L of methylammonium bromide (manufactured by GreatCell Solar Limited), 0.05 mol/L of cesium iodide (manufactured by Iwatani Corporation), and 0.05 mol/L of rubidium iodide (manufactured by Iwatani Corporation). The solvent for the solution was a mixture of dimethyl sulfoxide (manufactured by acros) and N,N-dimethyl formamide (manufactured by acros). The mixing ratio (DMSO:DMF) of dimethyl sulfoxide (DMSO) and N,N-dimethyl formamide (DMF) in the raw material solution was 1:4 in terms of volume ratio.

Thereafter, a raw material solution including the semiconductor material of the example was coated by spin coating to form a hole transport layer on the photoelectric conversion layer. The solvent for the raw material solution was toluene (manufactured by acros). The raw material solution included 10 g/L of the semiconductor of the example and tris(pentafluorophenyl)borane. Incidentally, six types of raw material solutions with different tris(pentafluorophenyl)borane concentrations were prepared. Specifically, raw material solutions respectively including 10 mol %, 20 mol %, 30 mol %, 40 mol %, 50 mol %, and 60 mol % of tris(pentafluorophenyl)borane per mole number based on the mass of repeating units of the semiconductor material of the example were prepared.

Thereafter, a second electrode was formed on the hole transport layer by depositing a Au membrane by vacuum vapor deposition. A solar cell of Example 1 was obtained in this manner.

Comparative Example 1

Poly[bis(4-phenyl)(2,4,6-trimethylphenyl)amine] (manufactured by Sigma-Aldrich Co. LLC) terminated by methyl groups was used instead of the semiconductor material of the example. A solar cell of Comparative Example 1 was obtained in the same manner as Example 1 except for the above point.

Example 2

In Example 2, a raw material solution including the semiconductor material of the example was coated by spin coating to form an organic semiconductor film on a glass substrate. The solvent for the raw material solution was toluene (manufactured by acros). The raw material solution included 10 g/L of the semiconductor material of the example and tris(pentafluorophenyl)borane. Incidentally, six types of raw material solutions with different tris(pentafluorophenyl)borane concentrations were prepared. Specifically, raw material solutions respectively including 1 mol %, 3 mol %, 10 mol %, 15 mol %, 20 mol %, and 25 mol % of tris(pentafluorophenyl)borane per mole number based on the mass of repeating units of the semiconductor material of the example were prepared. An organic semiconductor film of Example 2 was obtained in this manner.

Comparative Example 2

Poly[bis(4-phenyl)(2,4,6-trimethylphenyl)amine] (manufactured by Sigma-Aldrich Co. LLC) terminated by methyl groups was used instead of the semiconductor material of the example. An organic semiconductor film of Comparative Example 2 was obtained in the same manner as Example 2 except for the above point.

Photoelectric Conversion Efficiency Measurement

Photoelectric conversion efficiency of each of the solar cells of Example 1 and Comparative Example 1 was measured.

Figure 3:
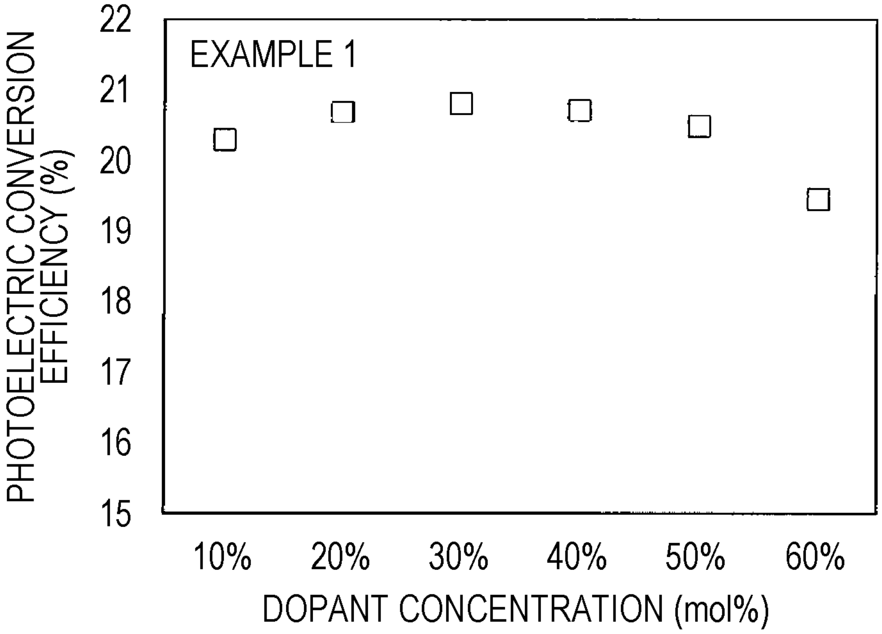
FIG. 3 is a graph illustrating dependence of photoelectric conversion efficiency of a solar cell of Example 1 on dopant concentrations.
Figure 4:
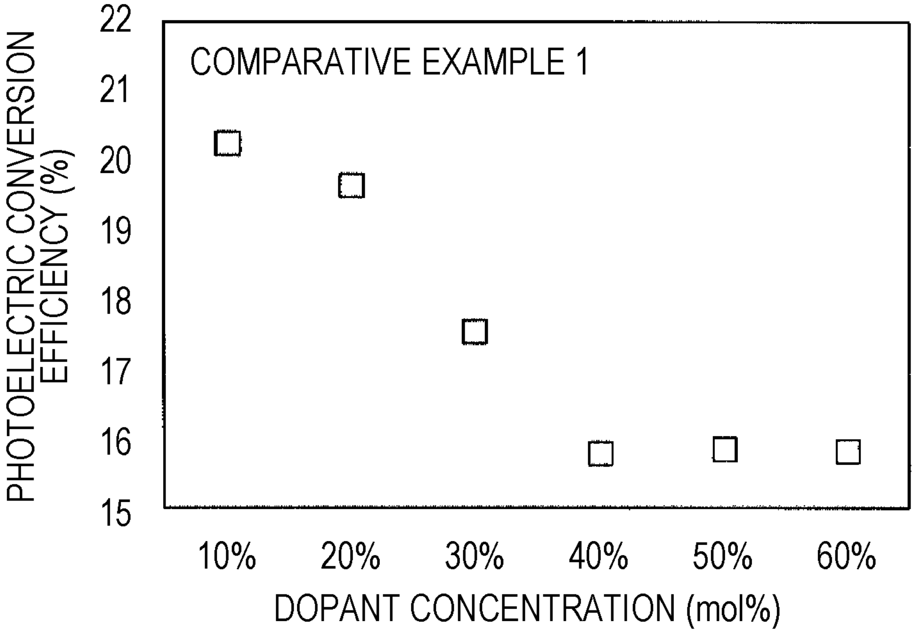
FIG. 4 is a graph illustrating dependence of photoelectric conversion efficiency of a solar cell of Comparative Example 1 on dopant concentrations.

An electrochemical analyzer (ALS440B, manufactured by BAS Inc.) and a xenon light source (BPS X300BA, manufactured by Bunkoukeiki Co., Ltd.) were used for measurement of the photoelectric conversion efficiency of the solar cells. Light strength was calibrated to 1 Sun (100 $mW/cm^2$) using a silicon photodiode before measurement. The sweep velocity of voltage was 100 mV/s. Preliminarily adjustment such as light irradiation and forward bias application for a long time was not carried out before starting measurement. Irradiation of light was conducted from the mask/substrate side in the state where the solar cell was masked with a black mask with an opening of 0.1 $cm^2$ in order to fix the effective area and reduce effect of scattering light. The photoelectric conversion efficiency (Eff) of each of the solar cells of Example 1 and the solar cells of Comparative Example 1 was measured in this manner. FIG. 3 is a graph illustrating dependence of the photoelectric conversion efficiency of the solar cell of Example 1 on dopant concentrations. FIG. 4 is a graph illustrating dependence of the photoelectric conversion efficiency of the solar cell of Comparative Example 1 on dopant concentrations.

Electron Spin Resonance (ESR) Analysis

ESR analysis was conducted on the organic semiconductor film of each of Example 2 and Comparative Example 2.

Since holes generated by doping an organic semiconductor has a spin of ½, the concentration of holes with which a PTAA is doped can be estimated by measuring the spin concentration by ESR. Dependence of the concentration of holes generated in the PTAA on the dopant concentration was compared through ESR measurement.

An X-band ESR device (JES-FA100, manufactured by JEOL Ltd.) was used for ESR measurement. Each of the organic semiconductor films of Example 2 and Comparative Example 2 was cut together with the glass substrate into a width of 3.5 mm, and put into a quartz ESR sample tube with an outer diameter of 5 mm to obtain an ESR signal. The spin concentration of the observed ESR signal was calibrated using a reference marker ($Mn^{2+}$) accompanying the device, and the relative change in the spin concentration was observed for each sample.

Figure 5:
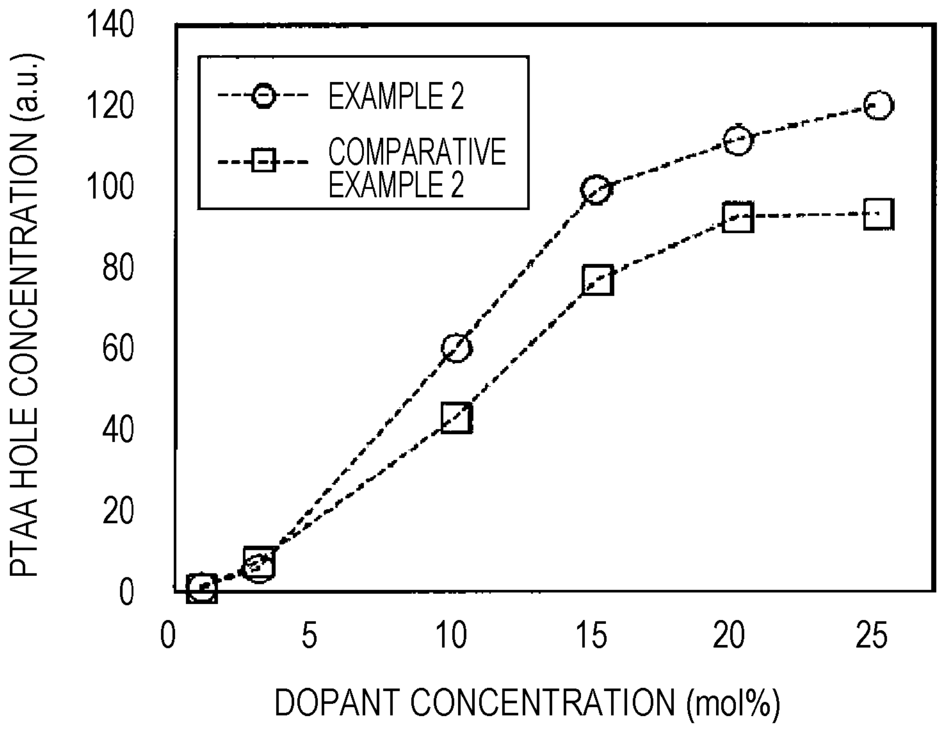
FIG. 5 is a graph illustrating dependence of hole concentrations of a polytriaryl-based semiconductor compound on dopant concentrations with respect to organic semiconductor films of Example 2 and Comparative Example 2.

When the PTAA was doped, a motional ESR signal suggesting a hole carrier was observed in the vicinity of the resonance position (g=2.0025) corresponding to a spin on the π electron orbital of a PTAA molecule. Dependence of the concentration of holes in the PTAA on the dopant concentration was obtained from this signal. FIG. 5 is a graph illustrating dependence of the hole concentration of the PTAA on the dopant concentration with respect to the organic semiconductor films of Example 2 and Comparative Example 2.

Effect of Terminal Groups on Solar Cell Characteristics

As shown in FIG. 3, in the case where the terminal groups of the PTAA were phenyl groups, the maximum photoelectric conversion efficiency was obtained when the dopant concentration was 30 mol %. On the other hand, as shown in FIG. 4, in the case where the terminal groups of the PTAA were methyl groups, the maximum solar cell efficiency was obtained when the dopant concentration was 10 mol %, and the characteristics monotonically deteriorated as the addition amount further increased.

As is clear from comparison between Example 1 and Comparative Example 1, Example 1 shows higher photoelectric conversion efficiency at any dopant concentration values. This result indicates that the PTAA has more excellent migration characteristics in the case where the terminal groups are phenyl groups than in the case where the terminal groups are methyl groups.

Effect of Terminal Groups on Dopant Activity

As shown in FIG. 5, when a PTAA having a phenyl group as a terminal group was used (that is, Example 2), the hole concentration of the PTAA shown is equal to or more than that in the case where a PTAA having a methyl group as a terminal group was used (that is, Comparative Example 2). In addition, although the hole concentration of the PTAA reached a peak at a dopant concentration of 20 mol % in the case of Comparative Example 2, the hole concentration of the PTAA continually increased even the dopant concentration exceeded 20 mol % in Example 2. This result indicates that both of the activation level and the acceptance level of the dopant are improved by using a PTAA having a phenyl group as a terminal group.

According to the present disclosure, migration characteristics of a semiconductor material and photoelectric conversion efficiency of a photoelectric conversion element such as a solar cell can be improved by using a PTAA having a certain terminal group.

What is claimed is:

1. A photoelectric conversion element, comprising: a first electrode, a photoelectric conversion layer, a hole transport layer, and a second electrode in this order, wherein the hole transport layer includes a semiconductor material represented by formula (I) below:

(I)

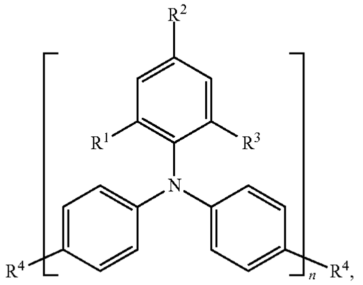

wherein $R^1$, $R^2$, and $R^3$ each independently represent a hydrogen atom or a hydrocarbon group having 1 to 6 carbon atoms, $R^4$ represents a phenyl group, and n represents an integer greater than or equal to 2, wherein the hole transport layer further includes tris(pentafluorophenyl)borane, and a molar ratio of the tris(pentafluorophenyl)borane with respect to a repeat unit of the semiconductor material is greater than or equal to 10% and is less than or equal to 60%.

2. The photoelectric conversion element according to claim 1, wherein a number average molecular weight is less than or equal to 8000.

3. The photoelectric conversion element according to claim 1, wherein the photoelectric conversion layer includes a perovskite compound.

4. The photoelectric conversion element according to claim 1, wherein the molar ratio of the tris(pentafluorophenyl)borane with respect to the repeat unit of the semiconductor material is greater than or equal to 20% and is less than or equal to 60%.

5. The photoelectric conversion element according to claim 1, wherein the molar ratio of the tris(pentafluorophenyl)borane with respect to the repeat unit of the semiconductor material is greater than or equal to 30% and is less than or equal to 50%.

* * * * *